United States Patent
Merrill (10) Patent No.: US 6,175,268 B1
(45) Date of Patent: Jan. 16, 2001

(54) MOS SWITCH THAT REDUCES CLOCK FEEDTHROUGH IN A SWITCHED CAPACITOR CIRCUIT

(75) Inventor: Richard Billings Merrill, Woodside, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/270,576

(22) Filed: Mar. 16, 1999

Related U.S. Application Data (62) Division of application No. 08/858,670, filed on May 19, 1994, now Pat. No. 5,900,657.

(51) Int. Cl.[7] .................................................. H03K 17/687
(52) U.S. Cl. ................................................. 327/574; 327/427
(58) Field of Search .................................... 257/365, 366; 327/204, 479, 577, 574, 427, 429, 434, 435, 437

(56) References Cited

U.S. PATENT DOCUMENTS

| | | | |
|---|---|---|---|
| 4,213,139 | * 7/1980 | Rao | 257/366 |
| 4,306,352 | * 12/1981 | Schrader | 257/366 |
| 4,472,821 | * 9/1984 | Mazin et al. | 257/366 |
| 4,794,565 | 12/1988 | Wu et al. | 365/185 |
| 5,115,288 | 5/1992 | Manley | 357/23.5 |
| 5,303,187 | * 4/1994 | Yu | 257/365 |
| 5,895,959 | * 4/1999 | Chang | 257/365 |

OTHER PUBLICATIONS

Allen, P. E. et al., "*CMOS Analog Circuit Design*," Oxford University Press, Chap. 5, pp. 204–211, (1987).

* cited by examiner

*Primary Examiner*—Toan Tran
(74) *Attorney, Agent, or Firm*—Limbach & Limbach, L.L.P.

(57) ABSTRACT

The accumulation of a small positive charge on the source of a MOS switch which occurs after the switch has been turned off due to the parasitic capacitance that exists between the gate and the source of the transistor, known as clock feedthrough, is reduced by utilizing a split-gate MOS transistor, and by continuously biasing one of the gates of the split-gate transistor.

23 Claims, 6 Drawing Sheets

MOS SWITCH THAT REDUCES CLOCK FEEDTHROUGH IN A SWITCHED CAPACITOR CIRCUIT

This is a divisional of application Ser. No. 08/858,670, filed May 19, 1997 now U.S. Pat. No. 5,900,657.

BACKGROUND OF THE INVENTION

1. Field of the Invention

The present invention relates to MOS switches and, more particularly, to a MOS switch that reduces clock feedthrough in a switched capacitor circuit.

2. Description of the Related Art

A MOS transistor is a device that controls a channel current, which flows from the drain to the source of the transistor, in response to a voltage applied to the gate of the transistor. As a result of this ability to control the channel current, MOS transistors are commonly used as voltage-controlled switches where the transistor provides a very-low resistance current path when turned on, and a very-high resistance current path when turned off.

Figure 1A:
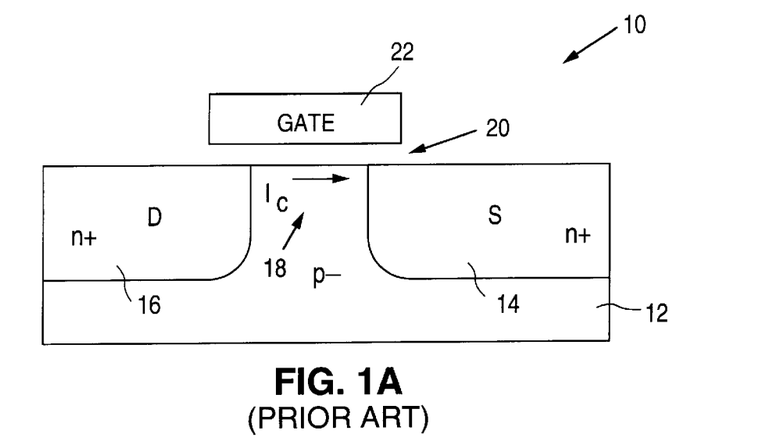
FIG. 1A is a cross-sectional diagram illustrating a conventional NMOS transistor 10.
Figure 1B:
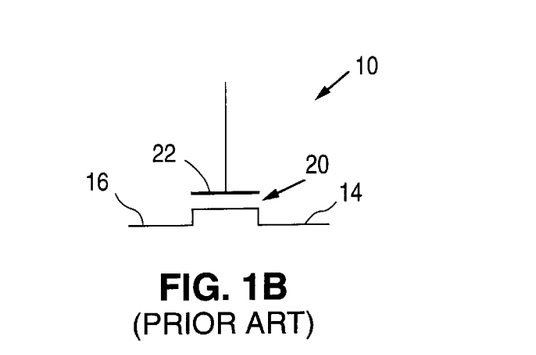
FIG. 1B is a schematic diagram illustrating transistor 10 of FIG. 1A.

FIGS. 1A–1B show cross-sectional and schematic diagrams, respectively, that illustrate a conventional NMOS transistor 10. As shown in FIGS. 1A–1B, transistor 10 includes n+ spaced-apart source and drain regions 14 and 16 which are formed in a p-type substrate 12, and a channel region 18 which is defined between source and drain regions 14 and 16. In addition, transistor 10 also includes a dielectric layer 20 which is formed over channel region 18, and a gate 22 which is formed over dielectric layer 20.

In operation, when voltages are applied to source and drain regions 14 and 16 so that the drain-to-source voltage $V_{DS}$ is greater than zero, and a voltage is applied to gate 22 so that the gate-to-source voltage $V_{GS}$ is greater than the threshold voltage $V_T$, transistor 10 turns on, thereby allowing a channel current $I_C$ to flow from drain region 16 to source region 14.

On the other hand, when the drain-to-source voltage $V_{DS}$ is greater than zero,. and a voltage is applied to gate 22 so that the gate-to-source voltage $V_{GS}$ is equal to or less than the threshold voltage $V_T$, transistor 10 turns off, thereby preventing channel current $I_C$ from flowing from drain 16 to source 14 (except for a leakage current).

Figure 2A:
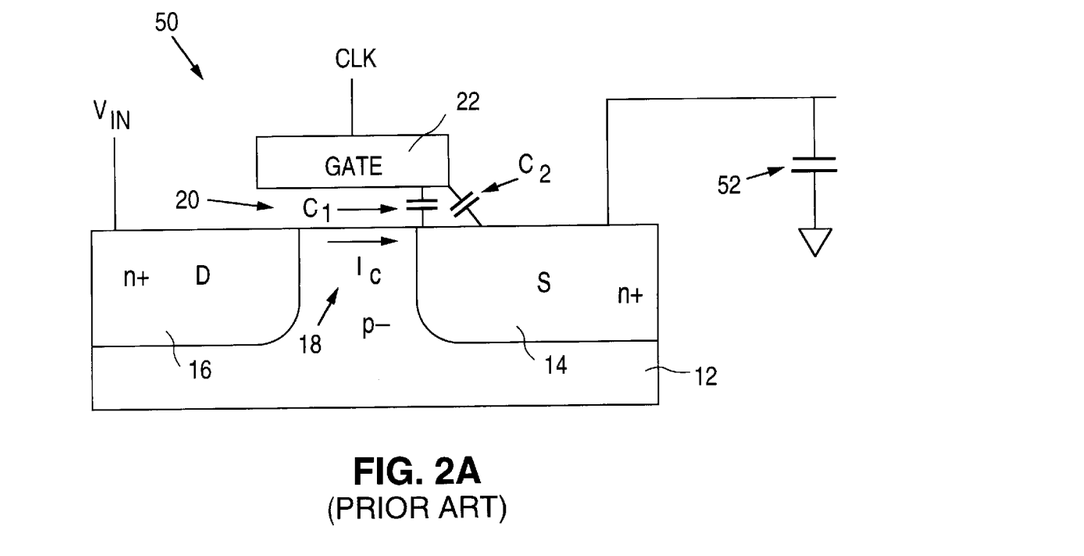
FIG. 2A is a cross-sectional diagram illustrating a conventional switched capacitor circuit 50.
Figure 2B:
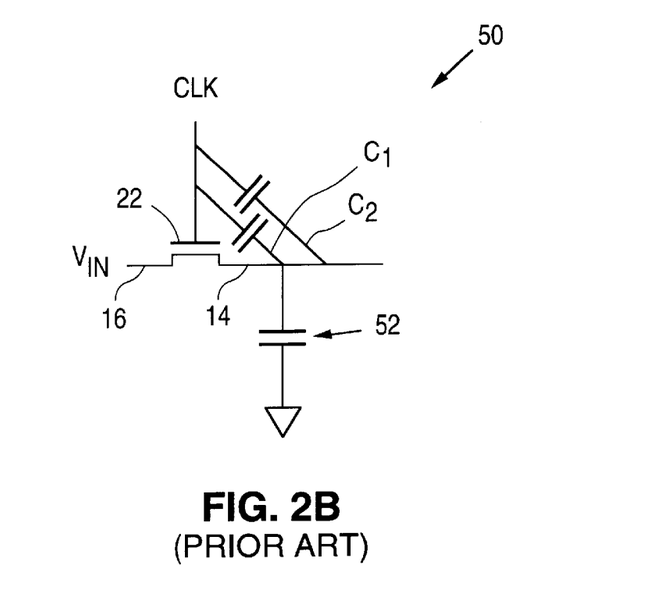
FIG. 2B is a schematic diagram illustrating switched capacitor circuit 50 of FIG. 2A.

One of the most common applications for MOS switches, which are used in a wide variety of applications, is in a switched capacitor circuit. FIGS. 2A–2B show cross-sectional and schematic diagrams, respectively, that illustrate a conventional switched capacitor circuit 50.

As shown in FIGS. 2A–2B, circuit 50 includes transistor 10 of FIG. 1 and a capacitor 52 which is connected between source region 14 and ground. In addition, drain region 16 is connected to receive an input signal $V_{IN}$, while gate 22 is connected to receive a clock signal CLK.

In operation, when the drain-to-source voltage $V_{DS}$ is greater than zero, and the gate-to-source voltage $V_{GS}$ is greater than the voltage on the source region 14 by the threshold voltage $V_T$, transistor 10 turns on. When transistor 10 turns on, a channel current $I_C$ flows from drain region 16 through source region 14 and charges up capacitor 52 to the voltage of the input signal $V_{IN}$ (assuming that the time that the clock signal CLK is high is much greater than the time constant defined by the turn-on resistance of transistor 10 and the capacitance of capacitor 52).

One drawback to the use of transistor 10 in switched capacitor circuit 50, however, is that the voltage applied to gate 22 via the clock signal CLK is capacitively coupled to source region 14 via a parasitic gate overlap capacitor $C_1$ which is formed from gate 22, dielectric layer 20, and source region 14, and via a parasitic lateral fringing field capacitor $C_2$ formed from gate 22, an insulation layer formed over source region 14, and source region 14.

This capacitive coupling, known as clock feedthrough, causes a small negative charge to accumulate at the surface of source region 14 below gate 22 (the lower plates of the parasitic capacitors $C_1$ and $C_2$), and a corresponding small positive charge to accumulate on the top plate of capacitor 52 when the clock voltage on gate 22 begins to rise, but is insufficient to turn on transistor 10 because the voltage on gate 22 is now greater than the voltage on source region 14.

Once the clock signal CLK turns transistor 10 on, capacitor 52, as noted above, charges up to the voltage of the input signal $V_{IN}$. Since capacitor 52 charges up to the input voltage $V_{IN}$, the small positive charge that accumulated on the top plate of capacitor 52 during the preturn-on period presents no problems.

The problem, however, comes after transistor 10 turns off. As the clock voltage on gate 22 continues to fall after transistor 10 has turned off, the capacitive coupling causes a small positive charge to accumulate at the surface of source region 14 below gate 22 (the lower plates of the parasitic capacitors $C_1$ and $C_2$), and a corresponding small negative charge to accumulate on the top plate of capacitor 52 because the voltage on gate 22 is now lower than the voltage on source region 14.

The small negative charge on the top plate of capacitor 52 functions as a negative offset voltage which, in turn, reduces the magnitude of the voltage held by capacitor 52. As a result, the voltage held by capacitor 52 at the end of the switched cycle erroneously represents the voltage of the input signal $V_{IN}$ by the small negative offset voltage.

Figure 3:
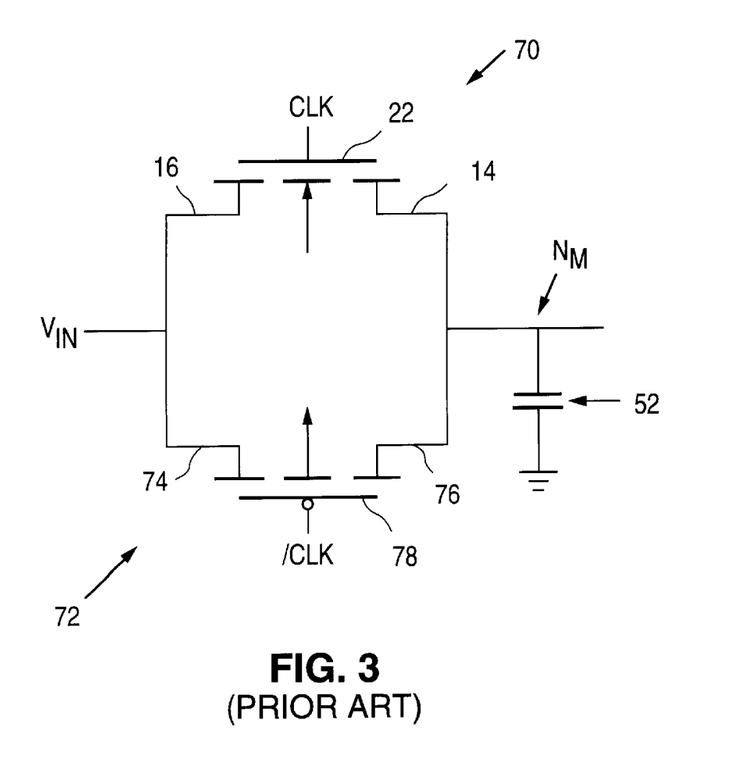
FIG. 3 is a schematic diagram illustrating a conventional switched capacitor circuit 70 that utilizes complementary MOS transistors.

One technique for reducing the negative offset voltage is to utilize a switched capacitor circuit with complementary MOS transistors. FIG. 3 shows a schematic diagram that illustrates a conventional switched capacitor circuit 70 that utilizes complementary MOS transistors.

As shown in FIG. 3, circuit 70 includes transistor 10 and capacitor 52 of FIGS. 2A and 2B, and a PMOS transistor 72. As shown, PMOS transistor 72 has a source 74 which is connected to drain 16 of transistor 10, a drain 76 which is connected to source 14 of transistor 10, and a gate 78 connected to receive an inverted clock signal /CLK.

In operation, when the clock signal CLK is high and the inverted clock signal /CLK is low, both transistors 10 and 72 are on. After transistors 10 and 72 turn off, the capacitive coupling of NMOS transistor 10 causes a small negative charge to accumulate on the top plate of capacitor 52, while PMOS transistor 72 causes of small positive charge to accumulate on the top plate of capacitor 52.

As a result, the negative charge that is injected onto the top plate of capacitor 52 by transistor 10 is theoretically cancelled out by the positive charge that is injected onto the top plate of capacitor 52 by transistor 72.

In actual practice, however, circuit 70 fails to completely remove the negative charge from capacitor 52 because the feedthrough parasitic capacitances of NMOS transistor 10 are typically not the same as the feedthrough parasitic capacitances of PMOS transistor 72.

In addition, the turn-on delays of NMOS transistor 10 and PMOS transistor 72 are not the same. As a result, the channel conductances of transistors 10 and 72 will typically not track each other during turn on and turn off. Thus, there is a need for a MOS switch that reduces clock feedthrough in a switched capacitor circuit.

SUMMARY OF THE INVENTION

Conventional MOS-based switched capacitor circuits suffer from the accumulation of a small positive charge on the source of the MOS transistor which occurs after the transistor has been turned off due to the parasitic capacitance that exists between the gate and the source of the transistor.

This small positive charge, known as clock feedthrough, also causes a small negative charge to accumulate on the capacitor which, in turn, prevents another device from accurately reading the voltage stored on the capacitor. In the present invention, clock feedthrough is reduced by utilizing a split-gate transistor, and by continuously biasing one of the gates.

A switched capacitor circuit in accordance with the present invention, which is formed in a semiconductor substrate, includes a transistor that has spaced-apart source and drain regions formed in the substrate, and a channel region which is defined between the source and drain regions. The channel region, in turn, has first, second, and third portions.

The transistor of the circuit also includes a layer of first dielectric material which is formed over the channel region, a first gate which is formed on the layer of first dielectric material over the first portion of the channel region, and a layer of second dielectric material which is formed over the first gate. Further, a second gate is formed on the layers of first and second dielectric materials over the second and third portions of the channel region and a portion of the first gate.

In addition to the transistor, the switched capacitor circuit also includes a capacitor which is connected to the source region and ground, or to the source region and another node.

In operation, the second gate is continuously biased with a voltage, while a control signal is applied to the first gate where the control signal switches the transistor on and off.

A better understanding of the features and advantages of the present invention will be obtained by reference to the following detailed description and accompanying drawings which set forth an illustrative embodiment in which the principles of the invention are utilized.

DETAILED DESCRIPTION

Figure 4A:
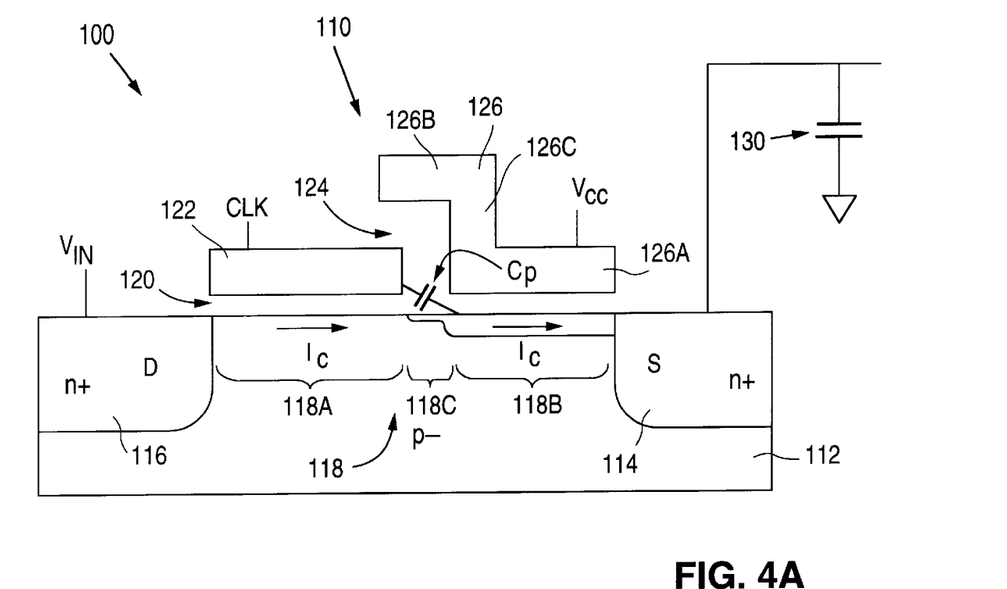
FIG. 4A is a cross-sectional diagram illustrating a switched capacitor circuit 100 in accordance with the present invention.
Figure 4B:
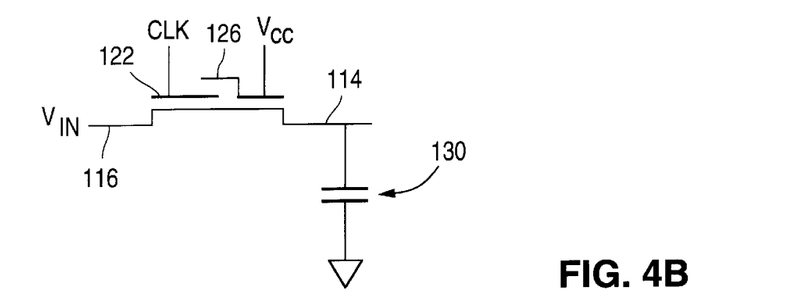
FIG. 4B is a schematic diagram illustrating circuit 100 of FIG. 4A.

FIGS. 4A–4B show cross-sectional and schematic diagrams, respectively, that illustrate a switched capacitor circuit 100 in accordance with the present invention. As described in greater detail below, circuit 100 reduces clock feedthrough by utilizing a split-gate MOS transistor where one of the gates is continuously dc biased.

As shown in FIGS. 4A–4B, circuit 100 includes a split-gate transistor 110 that has n+spaced-apart source and drain regions 114 and 116 which are formed in a p-type substrate 112, and a channel region 118 which is defined between source and drain regions 114 and 116. Channel region 118, in turn, includes a first portion 118A, a second portion 118B, and a third portion 118C.

In addition, transistor 110 also includes a lower dielectric layer 120 which is formed over channel region 118, a first gate 122 which is formed on dielectric layer 120 over the first portion 118A of channel region 118, and an upper dielectric layer 124 which is formed on the top and sidewall surfaces of first gate 122.

Further, a second gate 126, which has a lower level 126A, an upper level 126B, and an intermediate level 126C connected to lower and upper levels 126A and 126B, is formed on dielectric layer 120 and a portion of dielectric layer 124 so that the lower level 126A is formed over the second portion 118B of channel region 118, and the upper level 126B is formed over the third portion 118C of channel region 118 and a portion of gate 122.

As further shown in FIGS. 4A and 4B, switched capacitor circuit 100 also includes a capacitor 130 which is connected between source region 114 and ground.

Since transistor 110 is a split-gate transistor, the channel length of transistor 110 is approximately twice the length of transistor 10 of FIGS. 2A–2B. In addition, to maintain the speed of transistor 110, the width must be formed to be approximately twice the size of the width of transistor 10. If slower speeds are acceptable, smaller widths may be used.

In operation, drain region 116 is connected to receive an input signal $V_{IN}$, first gate 122 is connected to receive a clock signal CLK, and second gate 126 is continuously biased by a positive dc voltage source, such as the supply voltage Vcc, which, in turn, causes the surface of the second and third portions 118B and 118C of channel region 118 to invert.

As shown in FIG. 4A, the surface of the second portion 118B, which is under the lower level 126A of second gate 126, is strongly inverted, while the surface of the third portion 118C, which is under the upper level 126B of second gate 126, is weakly inverted due to the larger separation distance between upper level 126B and the surface of channel region 118.

When the voltage of the input signal $V_{IN}$ is greater than the voltage on source region 114, and the voltage of the clock signal CLK is greater than the voltage on source region 114 by the threshold voltage $V_T$, transistor 110 turns on.

When transistor 110 turns on, a channel current $I_C$ flows from drain region 116 through source region 114 and charges up capacitor 130 to the voltage of the input signal $V_{IN}$ (assuming that the time that the clock signal CLK is high is much greater than the time constant defined by the turn-on resistance of transistor 110 and the capacitance of capacitor 130).

When the drain-to-source voltage $V_{DS}$ is greater than zero, and the gate-to-source voltage $V_{GS}$ falls below the threshold voltage $V_T$, transistor 110 turns off. In the present invention, the time required for the clock signal CLK to fall from a logic high to a low must be long compared to the minimum time required to turn off transistor 110 which, for scaled CMOS, is approximately 1 nS.

As the voltage on first gate 122 continues to fall after transistor 110 has turned off, a very small positive charge accumulates at the surface of the third portion 118C of channel region 118 due to the capacitance of a parasitic capacitor $C_P$ formed from gate 122, second dielectric layer 124, and the weakly inverted third portion 118C of channel region 118, while a corresponding very small negative charge accumulates on the top plate of capacitor 130.

Thus, transistor 110 of the present invention eliminates the capacitance associated with the gate overlap parasitic capacitor $C_1$ of FIGS. 2A–2B, and reduces the capacitance associated with the lateral fringing field parasitic capacitor $C_2$ of FIGS. 2A–2B since the bottom plate of parasitic capacitor $C_P$ is located in the weakly inverted region of the third portion 118C of channel region 118 rather than source region 14 as is the case with the lateral fringing field parasitic capacitor $C_2$ of FIGS. 2A–2B.

Figure 5:
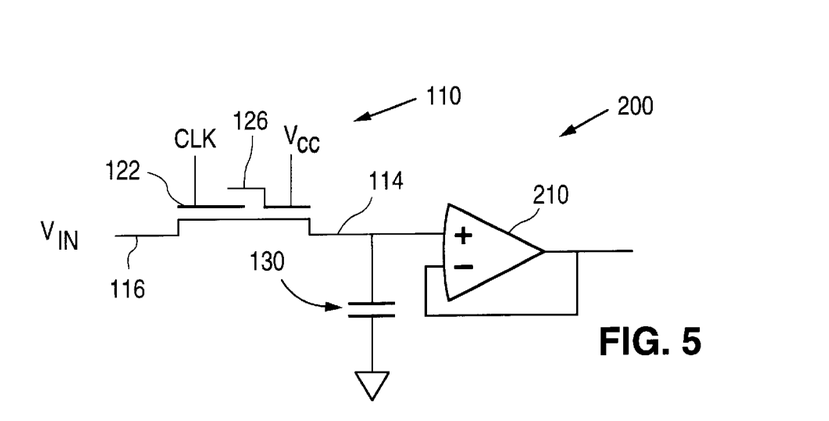
FIG. 5 is a schematic diagram illustrating switched capacitor circuit 100 as part of a sample and hold circuit 200 in accordance with the present invention.

The reduced clock feedthrough provided by transistor 110 can be used in a variety of circuits. FIG. 5 shows a schematic diagram that illustrates transistor 110 as part of a sample and hold circuit 200 in accordance with the present invention.

As shown in FIG. 5, circuit 200 includes transistor 110 and capacitor 130 of FIGS. 4A and 4B, and an operational amplifier 210 having a positive input connected to source region 114, and a negative input connected to the output of amplifier 210.

Figure 6:
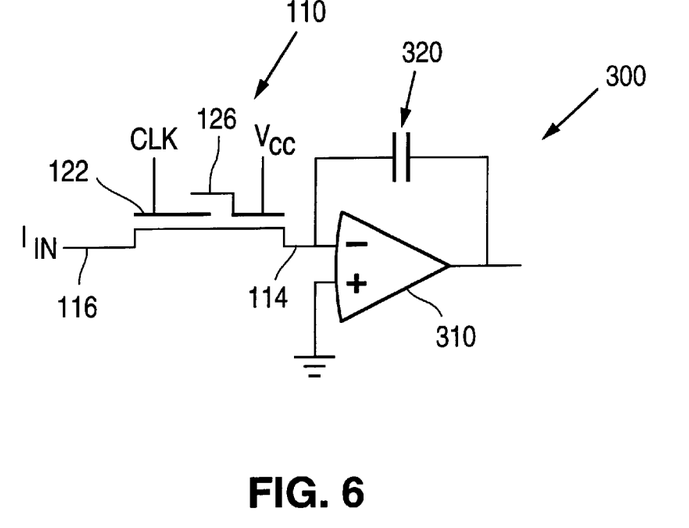
FIG. 6 is a schematic diagram illustrating transistor 110 as part of an integrator circuit 300 in accordance with the present invention.

In addition, switched capacitor circuits are not limited to applications where the capacitor is connected to ground. FIG. 6 shows a schematic diagram that illustrates transistor 110 as part of an integrator circuit 300 in accordance with the present invention.

As shown in FIG. 6, circuit 300 includes transistor 110 of FIGS. 4A and 4B, an operational amplifier 310 that has a positive input connected to ground and a negative input connected to source region 114, and a capacitor 320 which is connected between the negative input and the output of amplifier 310. In addition, drain 116 is connected to a current source $I_{IN}$ rather than the voltage source $V_{IN}$.

Figure 7:
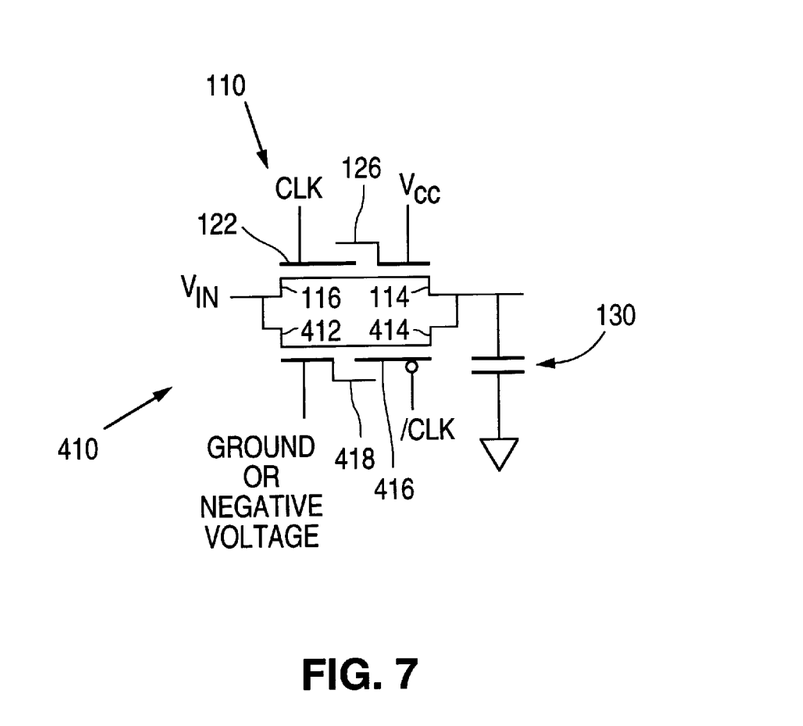
FIG. 7 is a schematic diagram illustrating a switched capacitor circuit 400 that utilizes complementary MOS transistors in accordance with the present invention.

Further, as with circuit 70 of FIG. 3, circuit 100 can be formed to use complementary MOS transistors. FIG. 7 shows a schematic diagram that illustrates a switched capacitor circuit 400 that utilizes complementary MOS transistors in accordance with the present invention.

As shown in FIG. 7, circuit 400 includes transistor 110 and capacitor 130 of FIGS. 4A and 4B, and a PMOS split-gate transistor 410. As shown, PMOS transistor 410 has a source 412 which is connected to drain 116 of transistor 110, a drain 414 which is connected to source 114 of transistor 10, a first gate 416 which is connected to receive an inverted clock signal /CLK, and a second gate 418 which is connected to ground or a negative voltage.

Figure 8A:
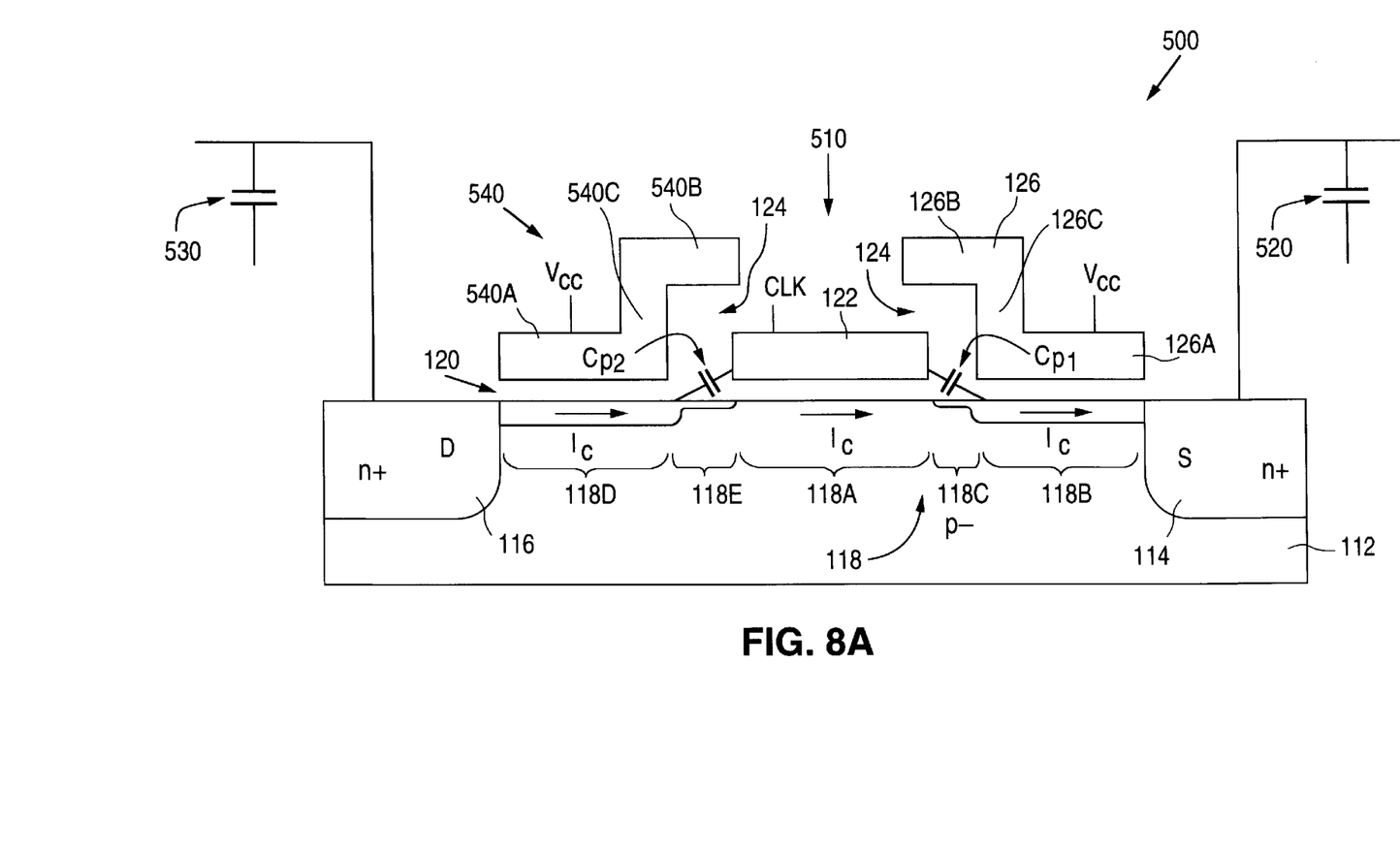
FIG. 8A is a cross-sectional diagram illustrating a switched capacitor circuit 500 in accordance with an alternative embodiment of the present invention.
Figure 8B:
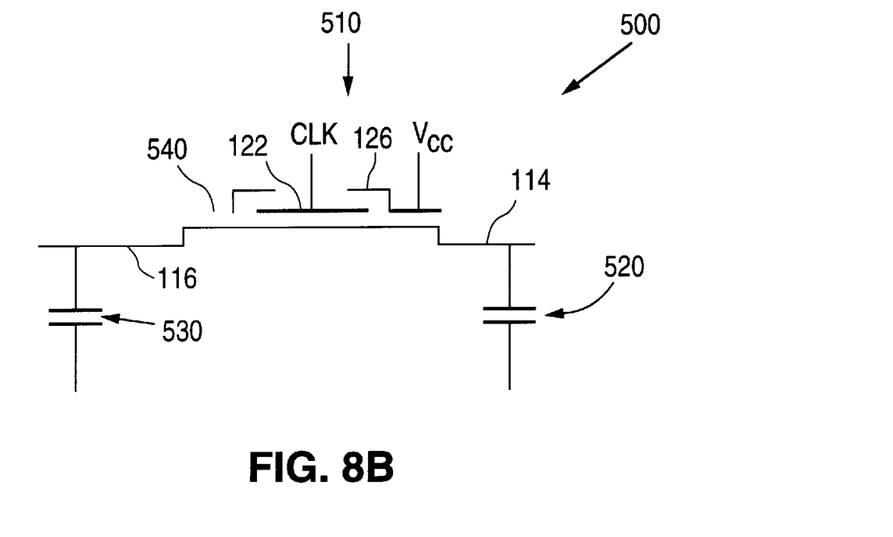
FIG. 8B is a schematic diagram illustrating circuit 500 of FIG. 8A.

FIGS. 8A–8B show cross-sectional and schematic diagrams, respectively, that illustrate a switched capacitor circuit 500 in accordance with an alternative embodiment of the present invention.

As shown in FIGS. 8A–8B, circuit 500 includes a double split-gate transistor 510, and a pair of matched capacitors 520 and 530. Transistor 510 differs from transistor 110 in that transistor 510 includes a channel region 118 that, in addition to first, second, and third portions 118A, 118B, and 118C, also includes a fourth portion 118D and a fifth portion 118E.

In addition, transistor 510 also includes a third gate 540 that has a lower level 540A, an upper level 540B, and an intermediate level 540C connected to lower and upper levels 540A and 540B. Third gate 540 is formed on dielectric layer 120 and a portion of dielectric layer 124 so that the lower level 540A is formed over the fourth portion 118D of channel region 118, and the upper level 540B is formed over the fifth portion 118E of channel region 118 and a portion of gate 122. Further, the top plate of capacitor 520 is connected to source region 114, while the top plate of capacitor 530 is connected to drain region 116.

In operation, first gate 122 is connected to receive a clock signal CLK, second gate 126 is continuously biased by a positive dc voltage source Vcc, and third gate 540 is continuously biased by the positive dc voltage source Vcc. The positive bias voltages applied to second and third gates 126 and 540 cause the surfaces of the second, third, fourth, and fifth portions 118B, 118C, 118D, and 118E of channel region 118 to invert.

As shown in FIG. 8A, the surfaces of the second and fourth portions 118B and 118D are strongly inverted, while the surfaces of the third and fifth portions 118C and 118E are weakly inverted due to the larger separation distances between upper levels 126B and 540B and the surface of channel region 118.

When the voltage on capacitor 530 is greater than the voltage on source region 114, and the voltage of the clock signal CLK is greater than the voltage on source region 114 by the threshold voltage VT, transistor 510 turns on.

When transistor 510 turns on, a channel current $I_C$ flows from drain region 116 through source region 114 and charges up capacitor 520 to one-half the voltage on capacitor 530 (assuming that the time that the clock signal CLK is high is much greater than the time constant defined by the turn-on resistance of transistor 510 and the capacitance of capacitor 520).

When the voltage of the clock signal CLK is less than the voltage on source region 114 by the threshold voltage $V_T$, transistor 510 turns off. In the present invention, the time required for the clock signal CLK to fall from a logic high to a low must be long compared to the minimum time required to turn off transistor 510 which, for scaled CMOS, is approximately 1 nS.

As the voltage on first gate 122 continues to fall after transistor 510 has turned off, a very small positive charge accumulates at the surface of the third portion 118C of channel region 118, and at the surface of fifth portion 118E due to the capacitance of parasitic capacitors $C_{P1}$ and $C_{P2}$ formed from gate 122, second dielectric layer 124, and the weakly inverted third and fifth portions 118C and 118E of channel region 118. At the same time, a corresponding very small negative charge accumulates on the top plates of capacitors 520 and 530.

Thus, transistor 510 eliminates the capacitances associated with the source and drain gate overlaps, and reduces the capacitances associated with the source and drain lateral fringing fields since the bottom plates of the parasitic capacitors $C_{P1}$ and $C_{P2}$ are located in the weakly inverted third and fifth portions 118C and 118E of channel region 118.

Figure 9:
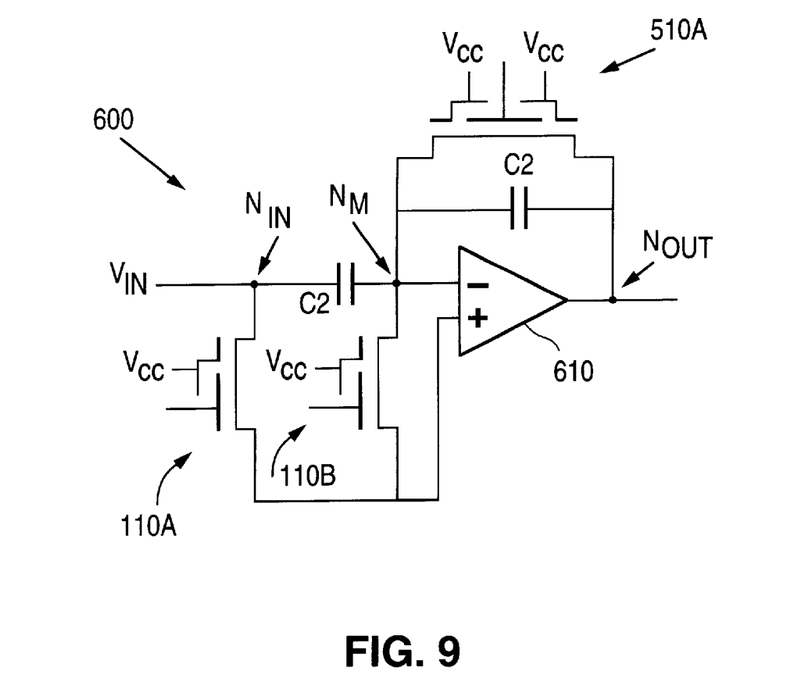
FIG. 9 is a schematic diagram illustrating a switched-capacitor amplifier circuit 600 that utilizes transistors 110 and 510 in accordance with the present invention.

The reduced clock feedthrough provided by transistors 110 and 510 can be used together in a variety of circuits. FIG. 9 shows a schematic diagram that illustrates a switched-capacitor amplifier circuit 600 that utilizes transistors 110 and 510 in accordance with the present invention.

As shown in FIG. 9, circuit 600 includes a first split-gate transistor 110A which is connected between ground and an input node $N_{IN}$, and a second split-gate transistor 110B which is connected between ground and an intermediate node $N_M$.

In addition, circuit 600 also includes a first capacitor C1 which is connected between the input node $N_{IN}$ and the intermediate node $N_M$, and a second capacitor C2, which is smaller than capacitor C1, which is connected between the intermediate node $N_M$ and an output node $N_{OUT}$.

Further, circuit 600 additionally includes a double split-gate transistor 510A which is connected between the intermediate node $N_M$ and the output node $N_{OUT}$, and an operational amplifier 610 which has a negative input connected to the intermediate node $N_M$, an output connected to the output node $N_{OUT}$, and a positive input connected to ground.

In operation, when transistor 110A is turned off, transistors 110B and 510A are turned on. Under these conditions, the intermediate and output nodes $N_M$ and $N_{OUT}$ are pulled to ground which, in turn, places an input voltage $V_{IN}$ across capacitor C1.

Next, transistors 110B and 510A are turned off, followed by the turn on of transistor 110A. Under these conditions, the voltage on the intermediate node $N_M$ tries to move towards $-V_{IN}$. This causes the output of operational amplifier 610 to go high which, in turn, places the voltage $V_{IN}$ across capacitor C2. As a result, an output voltage $V_{OUT}$ at the output node $N_{OUT}$ is defined by the equation $V_{OUT}=V_{IN}(C1/C2)$.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for operating a circuit having a transistor, the transistor having:
   spaced-apart source and drain regions;
   a channel region defined between the source and drain regions, the channel region contacting the source region and the drain region;
   a first gate, the first gate being formed over a portion of the channel region that contacts the source region, and not being formed over any portion of the channel region that contacts the drain region; and
   a second gate, the second gate being formed over a portion of the channel region that contacts the drain region, and not being formed over any portion of the channel region that contacts the source region;

the method comprising the steps of:
   applying a steady voltage to the second gate; and
   applying a control signal to the first gate, the control signal switching the transistor on and off.

2. A method for operating a circuit having a transistor that includes a first terminal, a second terminal, a first gate, and a second gate, the method comprising the steps of:
   applying a steady voltage to the second gate; and
   applying a control signal to the first gate, the control signal switching the transistor on and off, the first terminal being connected to receive an input signal, the circuit further having a capacitor connected between the second terminal and ground.

3. The method of claim 2 wherein the transistor further includes a channel region having a first portion, a second portion, and a third portion, the first gate being formed over the first portion, the second gate being formed over the second and third portions, and a portion of the first gate.

4. The method of claim 2 wherein the second gate has a lower level, an upper level, and an intermediate level connected to the lower and upper levels.

5. The method of claim 4 wherein the transistor further includes a channel region having a first portion, a second portion, and a third portion, the first gate being formed over the first portion, the lower level of the second gate being formed over the second portion, and the upper level of the second gate being formed over the third portion and a portion of the first gate.

6. The method of claim 2 wherein the second gate is biased by a positive voltage.

7. The method of claim 1 wherein the second gate is biased by a negative voltage.

8. The method of claim 1 wherein the second gate is biased by a supply voltage.

9. The method of claim 1 wherein the second gate has a lower level, an upper level, and an intermediate level connected to the lower and upper levels.

10. The method of claim 1 wherein the steady voltage is a power supply voltage.

11. A method for operating a circuit having a first transistor that includes a first terminal, a second terminal, a first gate, and a second gate; and a capacitor that is connected to the second terminal, the method comprising the steps of:
   applying a steady voltage to the second gate; and
   applying a control signal to the first gate, the control signal having a voltage level that changes.

12. The method of claim 11 wherein the second gate has a lower level, an upper level, and an intermediate level connected to the lower and upper levels.

13. The method of claim 11 wherein the steady voltage is a power supply voltage.

14. A method for operating a circuit having a transistor, the transistor having:
   spaced-apart first drain and source regions of a first conductivity type;
   a first channel region defined between the first drain and source regions, the first channel region contacting the first drain region and the first source region;
   a first gate, the first gate being formed over a portion of the first channel region that contacts the first drain region, and not being formed over any portion of the first channel region that contacts the first source region; and
   a second gate, the second gate being formed over a portion of the first channel region that contacts the first source region, and not being formed over any portion of the first channel region that contacts the first drain region;

the method comprising the steps of:

applying a steady voltage to the second gate; and applying a control signal to the first gate, the control signal having a voltage level that changes.

15. The method of claim 14 wherein the second gate has a lower level, an upper level, and an intermediate level connected to the lower and upper levels.

16. The method of claim 14 wherein the steady voltage is a power supply voltage.

17. The method of claim 14 wherein the circuit includes a capacitor connected to the first source region.

18. The method of claim 17 wherein the capacitor is also connected to ground.

19. The method of claim 17 wherein the circuit further includes an operational amplifier connected to the capacitor.

20. The method of claim 19 wherein the operational amplifier has a positive input connected to the first source region.

21. The method of claim 19 wherein the operational amplifier has a negative input connected to the first source region.

22. The method of claim 14 wherein the circuit further includes a second transistor that includes spaced-apart second drain and source regions of a second conductivity type;

a second channel region defined between the second drain and source regions, the second channel region contacting the second drain region and the second source region;

a third gate, the third gate being formed over a portion of the second channel region that contacts the second drain region, and not being formed over any portion of the channel region that contacts the second source region; and a fourth gate, the fourth gate being formed over a portion of the second channel region that contacts the second source region, and not being formed over any portion of the second channel region that contacts the second drain region;

the first source and second drain regions being connected together, the first drain and second source being connected together, the fourth gate being connected to another steady voltage.

23. The method of claim 14 wherein the first transistor further includes a third gate formed over a portion of the first channel region that contacts neither the first drain region nor the first source region, and wherein the steady voltage is applied to the third gate.

* * * * *

UNITED STATES PATENT AND TRADEMARK OFFICE
CERTIFICATE OF CORRECTION

PATENT NO. : 6,175,268 B1
DATED : January 16, 2001
INVENTOR(S) : Merrill

It is certified that error appears in the above-identified patent and that said Letters Patent is hereby corrected as shown below:

Title Page,
Item [62] delete "Division of application no. 08/858, 670, filed on May 19, 1994, now Pat. No. 5,900,657" and replace with -- Division of application No. 08/858,670, May 19, 1997, Pat. No. 5,900,657 --.

Signed and Sealed this

Ninth Day of October, 2001

Attest:

NICHOLAS P. GODICI
Attesting Officer
Acting Director of the United States Patent and Trademark Office